United States Patent
Kim et al.

(10) Patent No.: US 7,315,451 B2
(45) Date of Patent: Jan. 1, 2008

(54) HEAT DISSIPATION STRUCTURE FOR DISPLAY PANEL AND DISPLAY MODULE EQUIPPED WITH THE STRUCTURE

(75) Inventors: Sok-San Kim, Suwon-si (KR); Ki-Jung Kim, Suwon-si (KR); Won-Sung Kim, Suwon-si (KR); Tae-Kyoung Kang, Suwon-si (KR); Myoung-Kon Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 31 days.

(21) Appl. No.: 11/265,075

(22) Filed: Nov. 3, 2005

(65) Prior Publication Data

US 2006/0098412 A1    May 11, 2006

(30) Foreign Application Priority Data

Nov. 10, 2004    (KR) .................... 10-2004-0091527

(51) Int. Cl.
    *H05K 7/20*    (2006.01)
(52) U.S. Cl. .................. 361/704; 361/681; 361/682; 361/714; 313/46; 313/582; 428/319.1; 445/66; 362/294
(58) Field of Classification Search ............ 361/687, 361/702, 703, 704, 705–712, 816, 818; 313/46, 313/582, 493, 573; 428/356, 355 BL, 440, 428/441, 461, 465, 521, 317.9, 317.1, 317.7, 428/319.1, 447, 423.1, 425.5, 425.6, 425.8; 362/294, 373
See application file for complete search history.

(56) References Cited

U.S. PATENT DOCUMENTS

| | | | | |
|---|---|---|---|---|
| 5,971,566 A | * | 10/1999 | Tani et al. | 362/294 |
| 5,990,618 A | * | 11/1999 | Morita et al. | 313/582 |
| 6,346,334 B1 | * | 2/2002 | Kamitani | 428/521 |
| 6,794,026 B2 | * | 9/2004 | Ebihara et al. | 428/319.1 |
| 7,081,031 B2 | * | 7/2006 | Hirano et al. | 445/66 |
| 7,176,605 B2 | * | 2/2007 | Bae et al. | 313/46 |
| 2005/0077822 A1 | * | 4/2005 | Kim et al. | 313/582 |

FOREIGN PATENT DOCUMENTS

JP    411251777 A   *  9/1999

\* cited by examiner

*Primary Examiner*—Michael Datskovskiy
(74) *Attorney, Agent, or Firm*—Robert E. Bushnell, Esq.

(57) ABSTRACT

A heat dissipation structure for a display panel efficiently dissipates heat generated during operation of the display panel, and a display module including the heat dissipation structure is also so characterized. The heat dissipation structure is capable of preventing electromagnetic waves generated during the operation of the display panel operation from adversely influencing a driving circuit. The heat dissipation structure comprises: a display panel; a heat dissipating sheet contacting a rear surface of the display panel; and a chassis base disposed on a rear side of the heat dissipating sheet and connected to the display panel via a double-sided adhesive element. The heat dissipating sheet includes two heat dissipating layers and a metal sheet layer interposed between the two heat dissipating layers.

17 Claims, 8 Drawing Sheets

HEAT DISSIPATION STRUCTURE FOR DISPLAY PANEL AND DISPLAY MODULE EQUIPPED WITH THE STRUCTURE

CLAIM OF PRIORITY

This application makes reference to, incorporates the same herein, and claims all benefits accruing under 35 U.S.C. § 119 from an application entitled STRUCTURE FOR HEAT DISSIPATION OF DISPLAY PANEL, AND DISPLAY MODULE EQUIPPED WITH THE SAME, earlier filed in the Korean Intellectual Property Office on Nov. 10, 2004 and there duly assigned Serial No. 10-2004-0091527.

BACKGROUND OF THE INVENTION

1. Technical Field

The present invention relates to a heat dissipation structure for a display panel and a display module equipped with the structure. More particularly, the invention relates to a heat dissipation structure for a display panel which can efficiently discharge heat generated during the operation of the display panel, and which can prevent malfunction of a driving circuit due to electromagnetic waves generated during the operation of the display panel, and a display module equipped with the structure.

2. Related Art

A display module used in a plasma display device comprises a display panel, a plurality of driving circuit boards including circuits for driving the display panel, and a chassis which supports the driving circuit boards.

The display panel is formed by coupling a front board and a rear board, and is electrically connected to the driving circuit boards by connection cables.

Since the front side of the chassis is supported by the display panel and the rear side of the chassis is supported by the driving circuit boards, a reinforcement member is additionally mounted to the chassis to supplement the strength of the chassis. A chassis base acts as a ground for a circuit connected to the display panel and the driving circuit boards, and cools the display panel by discharging heat generated during the operation of the display panel. The chassis base also supports the display panel and the driving circuit boards.

The display panel and the chassis base maybe adhered to each other by a double-sided adhesive element. A heat dissipating sheet may be disposed between the display panel and the chassis base to dissipate the heat generated during the operation of the display panel.

A heat dissipating sheet is disposed between the display panel and the chassis base so that the heat generated during the operation of the display panel is smoothly transmitted and dissipated through the heat dissipating sheet. However, an air layer is formed between the heat dissipating sheet and the chassis base, and thus, only a portion of the heat dissipating sheet contacts the chassis base. The air layer interferes with the dissipation of the heat generated during the operation of the display panel through the chassis base, and thus, there is a need for a heat dissipation structure to effectively cool the display panel.

SUMMARY OF THE INVENTION

The present invention provides a heat dissipation structure for a display panel which can efficiently dissipate heat generated during the operation of the display panel, and a display module including the heat dissipation structure.

The present invention also provides a heat dissipation structure for a display panel which can prevent electromagnetic waves generated during the operation of the display panel from affecting a driving circuit.

According to an aspect of the present invention, there is provided a heat dissipation structure of a display panel, comprising: a display panel; a heat dissipating sheet contacting a rear surface of the display panel; and a chassis base disposed on a rear side of the heat dissipating sheet and connected to the display panel via a double-sided adhesive element; wherein the heat dissipating sheet includes two heat dissipating layers and a metal sheet layer interposed between the two heat dissipating layers.

Preferably, both of the heat dissipating layers are made of graphite, one of the two heat dissipating layers contacts the display panel and is made of graphite, and the other heat dissipating layer contacts the chassis base and is made of a material from a silicon group or acryl group.

The heat dissipating sheet may not extend to the edges of the rear surface of the display panel, the double-sided adhesive element may be disposed a predetermined distance from the heat dissipating sheet, and an Electro Magnetic Interference (EMI) sponge may be disposed in the space between the heat dissipating sheet and the double-sided adhesive element.

Preferably, the metal sheet layer includes a bent end portion extending to and contacting the display panel, and the EMI sponge is disposed in the space between the bent end portion and the chassis base, or the metal sheet layer includes a bent end portion extending to and contacting the chassis base, and the EMI sponge is disposed in the space between the bent end portion and the display panel. Alternatively, the end of the metal sheet layer extends further than the two heat dissipating layers, and the EMI sponge is disposed on the front and rear surfaces of the metal sheet layer.

The heat dissipation sheet may not extend to the edges of the rear surface of the display panel, the double-sided adhesive element may be disposed a predetermined distance from the heat dissipating sheet, and the EMI sponge may be disposed on a side of the double-sided adhesive element opposite to the heat dissipating sheet between the chassis base and the display panel.

The display panel may be a plasma display panel.

According to another aspect of the present invention, there is provided a display module comprising: a display panel; a driving circuit board driving the display panel; a chassis base supporting the display panel and the driving circuit board; and a heat dissipating sheet having a surface contacting a rear surface of the display panel; wherein the chassis base is connected to the display panel via a double-sided adhesive element, the heat dissipating sheet includes two heat dissipating layers, and a metal sheet layer is interposed between the two heat dissipating layers.

Preferably, both of the heat dissipating layers are made of graphite, one of the two heat dissipating layers contacts the display panel and is made of graphite, and the other heat dissipating layer contacts the chassis base and is made of a material from a silicon group or acryl group.

The heat dissipating sheet may not extend to the edges of the rear surface of the display panel, the double-sided adhesive element may be disposed a predetermined distance from the heat dissipating sheet, and an EMI sponge may be disposed in the space between the heat dissipating sheet and the double-sided adhesive element.

Preferably, the metal sheet layer includes a bent end portion extending to and contacting the display panel, and the EMI sponge is disposed in the space between the bent end portion and the chassis base, or the metal sheet layer includes a bent end portion extending to and contacting the chassis base, and the EMI sponge is disposed in the space between the bent end portion and the display panel. Alternatively, the end of the metal sheet layer extends further than the two heat dissipating layers, and the EMI sponge is disposed on the front and rear surfaces of the metal sheet layer.

The heat dissipation sheet may not extend to the edges of the rear surface of the display panel, the double-sided adhesive element may be disposed a predetermined distance from the heat dissipating sheet, and the EMI sponge may be disposed on a side of the double-sided adhesive element opposite to the heat dissipating sheet between the chassis base and the display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
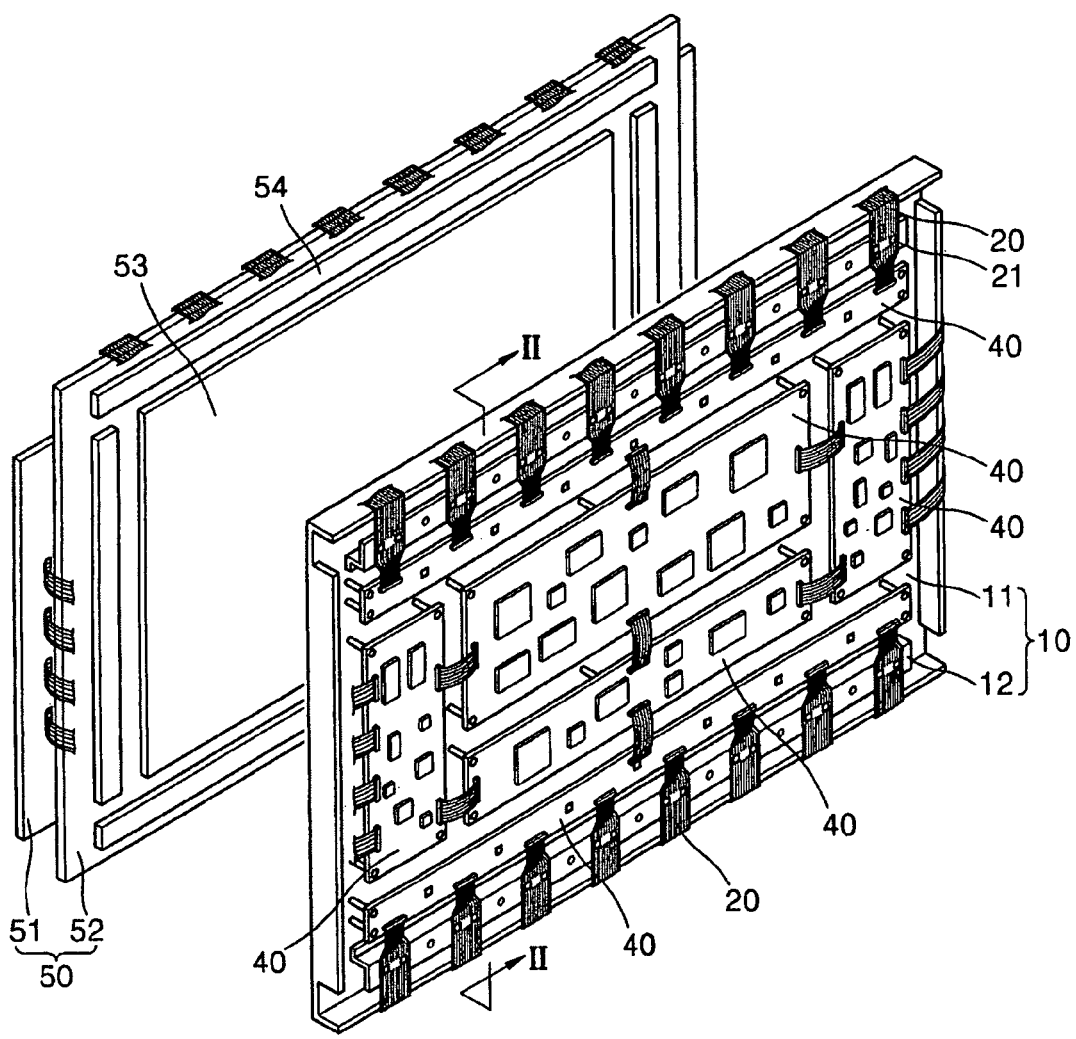
FIG. 1 is an exploded perspective view of a display module.

The present invention will now be described more fully with reference to the accompanying drawings, in which exemplary embodiments of the invention are shown. Like reference numerals in the drawings denote like elements, and thus their description will not be repeated.

FIG. 1 is a perspective view of a display module used in a plasma display device, which is a flat display device.

Referring to FIG. 1, the display module used in a plasma display device includes a display panel 50, a plurality of driving circuit boards 40 including circuits for driving the display panel 50, and a chassis 10 that supports the driving circuit boards 40.

The display panel 50 is formed by coupling a front board 51 and a rear board 52, and is electrically connected to the driving circuit boards 40 by connection cables 20.

Since the front side of the chassis 10 is supported by the display panel 50 and the rear side of the chassis 10 is supported by the driving circuit board 40, a reinforcement member 12 is additionally mounted to the chassis 10 to supplement the strength of the chassis 10. A chassis base 11 acts as a ground for a circuit connected to the display panel 50 and the driving circuit board 40, and cools the display panel 50 by discharging heat generated during the operation of the display panel 50. The chassis base 11 also supports the display panel 50 and the driving circuit boards 40.

The display panel 50 and the chassis base 11 may be adhered to each other by a double-sided adhesive element 54. A heat dissipating sheet 53 may be disposed between the display panel 50 and the chassis base 11 so as to dissipate heat generated during the operation of the display panel 50.

Figure 2:
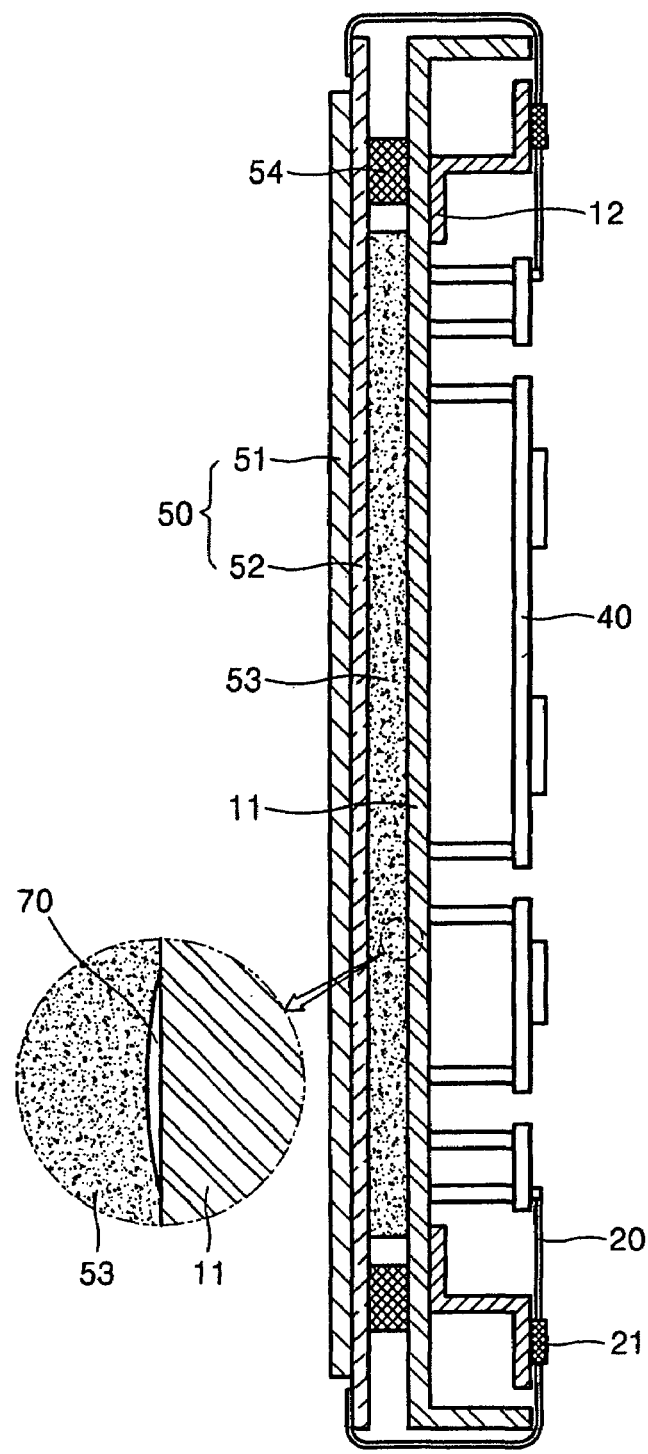
FIG. 2 is a cross-sectional view taken along line II-II of FIG. 1.

FIG. 2 is a cross-sectional view taken along line II-II of FIG. 1.

Referring to FIG. 2, the heat dissipating sheet 53 is disposed between the display panel 50 and the chassis base 11 so that heat generated during the operation of the display panel 50 is smoothly transmitted and dissipated through the heat dissipating sheet 53. However, an air layer 70 is formed between the heat dissipating sheet 53 and the chassis base 11, and thus, less than 50 percent of the heat dissipating sheet 53 contacts the chassis base 11. The air layer 70 interferes with the dissipation of the heat generated during the operation of the display panel 50 through the chassis base 11, and thus, there is a need for a heat dissipation structure to effectively cool the display panel 50.

Figure 3:
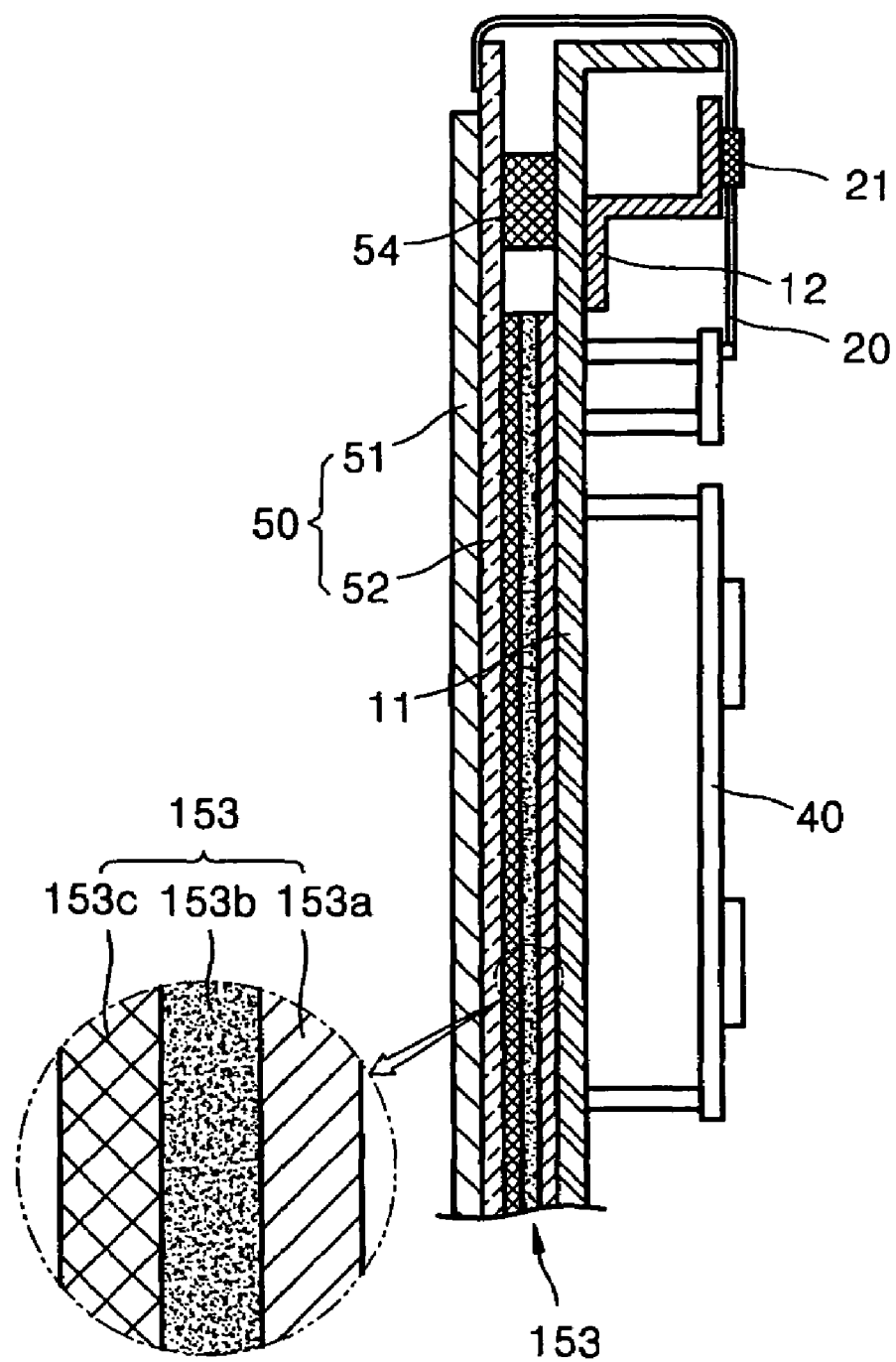
FIG. 3 is a cross-sectional view of a heat dissipation structure of a display panel according to a first embodiment of the present invention.

FIG. 3 is a cross-sectional view of a heat dissipation structure of a display panel according to a first embodiment of the present invention.

Referring to FIG. 3, the heat dissipation structure of a display panel according to the first embodiment includes a display panel 50, a heat dissipating sheet 153, and a chassis base 11.

The display panel 50 is not limited to a plasma display panel, which is described herein merely as an example, and any display panel which generates heat during its operation and which needs to dissipate the heat for cooling may be used.

The heat dissipating sheet 153 contacts a rear surface of the display panel 50 and transmits the heat generated during the operation of the display panel 50 to the chassis base 11 for dissipation. The heat dissipating sheet 153 includes two heat dissipating layers 153a and 153c which are made of graphite, which has a high thermal conductivity, and a metal sheet layer 153b interposed between the heat dissipating layers 153a and 153c. The metal sheet layer 153b may be an aluminum layer or the like.

The heat dissipating layers 153a and 153c are, preferably, made of a material having high thermal conductivity, such as silicon, acryl, or urethane, instead of graphite, or are manufactured by mixing ultrafine ferrite particles or a conductive filler.

Alternatively, the two heat dissipating layers 153a and 153c may be made of different materials. In this case, the dissipating layer 153a which contacts the chassis base 11 may be made of a material included in the silicon or acryl group. A contact area between the layer made of a material included in the silicon or acryl group and the chassis base 11 is larger than a contact area between a graphite layer and the chassis base 11, even when a large force is not applied, since the material included in the silicon or acryl group has better elastic properties. Therefore, heat generated during the operation of the display panel 50 can be smoothly transmitted to the chassis base 11.

The chassis base 11 is a thin plate, and a reinforcement member 12 is installed on the rear side of the chassis base 11 to supplement the strength of the chassis base 11. The display panel 50 is connected to the front side of the chassis base 11 by an adhesive element 54, and the rear side of the chassis base 11 is connected to a driving circuit board 40.

In the above structure, the thermal conduction of the heat dissipating sheet 153 is greater than that of a conventional heat dissipating sheet, and the heat generated during the operation of the display panel 50 is smoothly dissipated. Moreover, the metal sheet layer 153b not only improves the thermal conductivity of the heat dissipating sheet 153, but also shields the driving circuit board 40 from electromagnetic waves generated during the operation of the display panel 50 or the driving circuit board 40 during the operation of the display panel 50.

Figure 4:
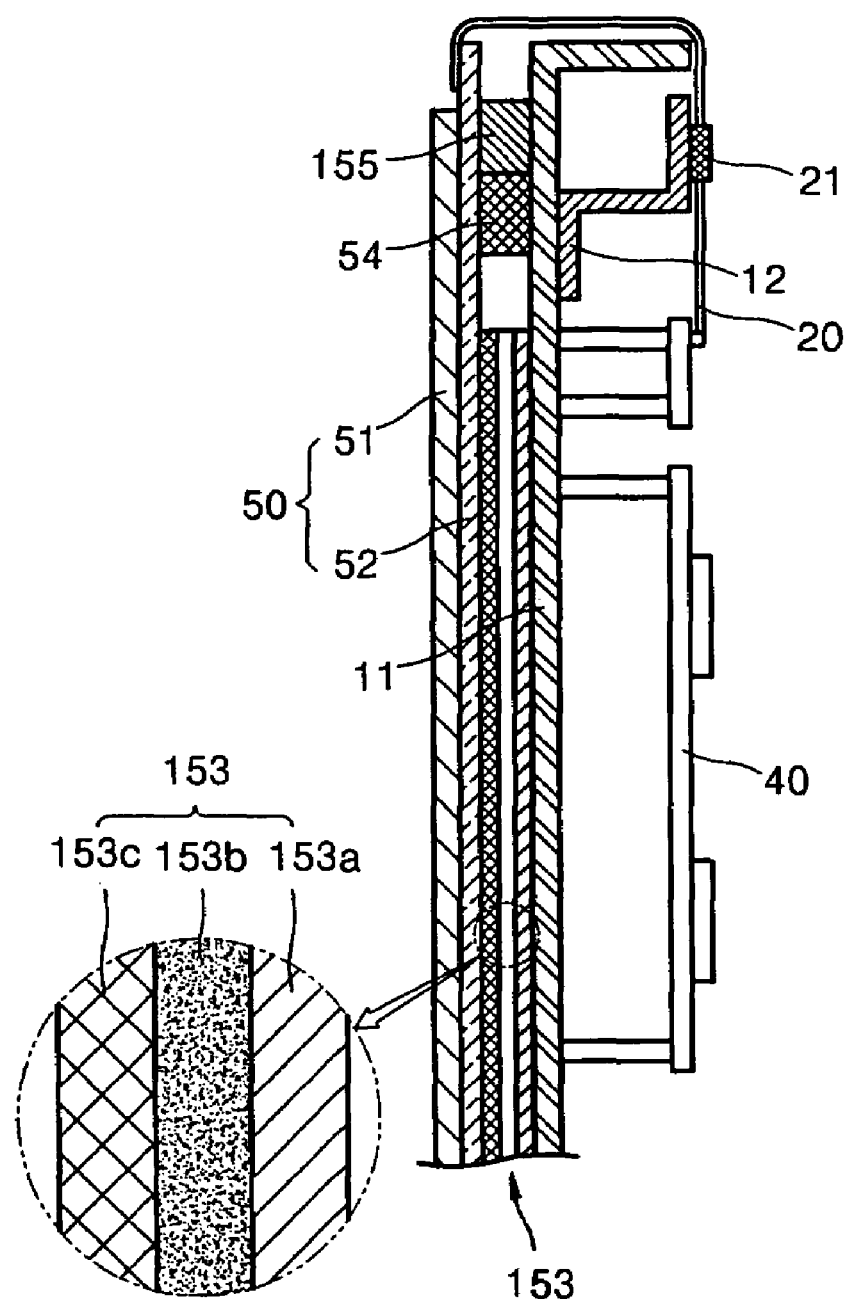
FIG. 4 is a cross-sectional view of a heat dissipation structure of a display panel according to a second embodiment of the present invention.

FIG. 4 is a cross-sectional view of a heat dissipation structure of a display panel 50 according to a second embodiment of the present invention.

Referring to FIG. 4, the heat dissipation structure according to the present embodiment includes the display panel 50, a heat dissipating sheet 153, a chassis base 11, and an Electro Magnetic Interference sponge or EMI sponge 155.

The display panel 50 and the heat dissipating sheet 153 of FIG. 4 are the same as the display panel 50 and the heat dissipating sheet 153 of FIG. 3.

In the present embodiment, the chassis base 11 is composed of a conductive material.

The EMI sponge 155 is formed by adhering a conductive fabric, a conductive film or a metal foil to the outside of an elastic sponge, and it is disposed in a region where the heat dissipating sheet 153 is not disposed between the display panel 50 and the chassis base 11. That is, the EMI sponge 155 is disposed on the opposite side of a double-sided adhesive element 54 from the heat dissipating sheet 153. The EMI sponge 155 contacts the display panel 50 and the chassis base 11.

In the heat dissipation structure according to the second embodiment, the heat dissipating sheet 153 has a multi-layer structure, thus improving thermal conductivity, and at the same time, the display panel 50 and the chassis base 11 are electrically connected to each other. Therefore, the influence of electromagnetic waves on the driving circuit board 40 installed on the rear side of the chassis base 11, and on circuit elements disposed on the driving circuit board 40, is significantly reduced.

Figure 5:
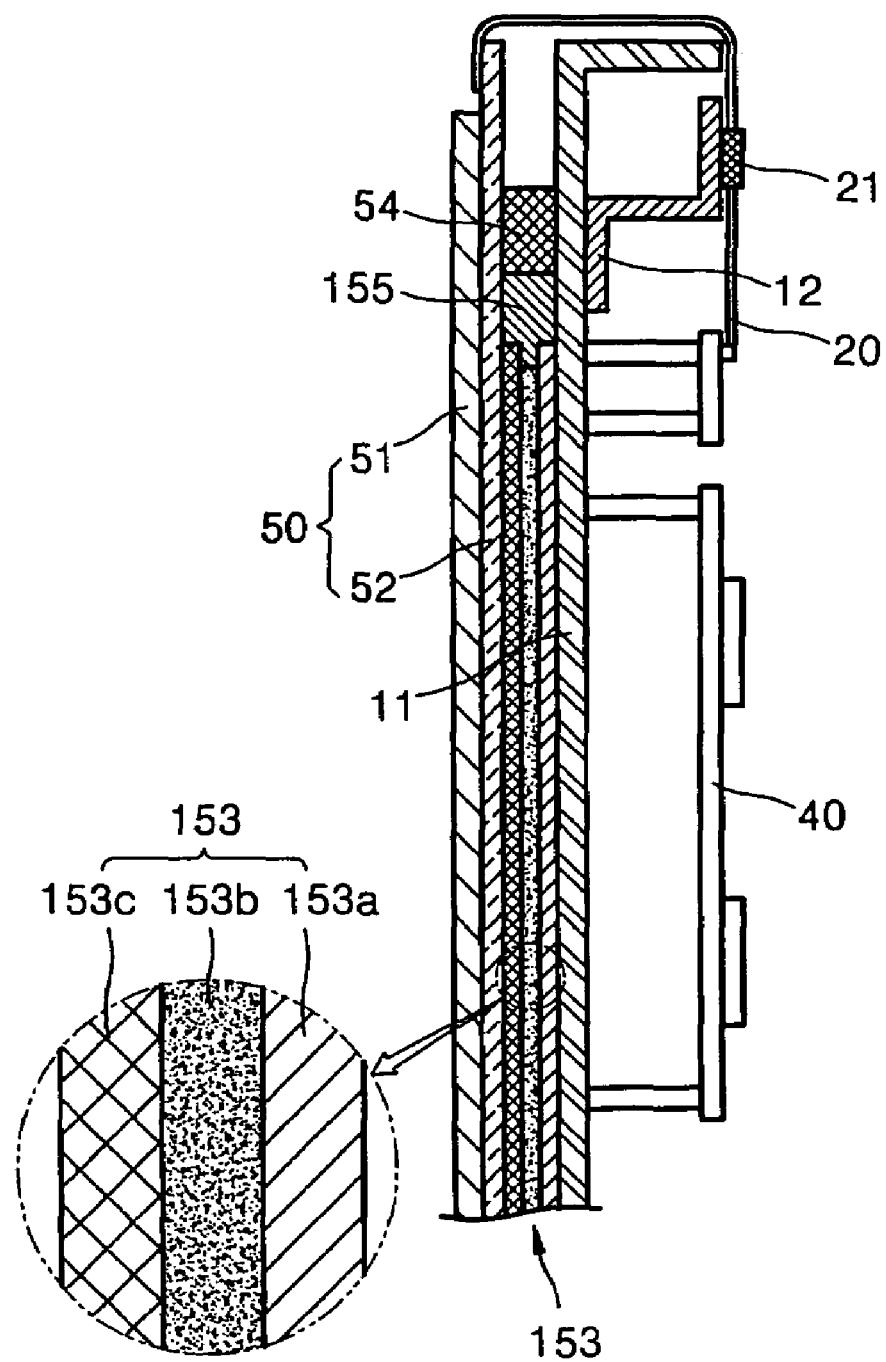
FIG. 5 is a cross-sectional view of a heat dissipation structure of a display panel according to a third embodiment of the present invention.

FIG. 5 is a cross-sectional view of a heat dissipation structure of a display panel 50 according to a third embodiment of the present invention.

Referring to FIG. 5, the heat dissipation structure includes the display panel 50, a heat dissipating sheet 153, a chassis base 11, and an EMI sponge 155.

The display panel 50 and the heat dissipating sheet 153 of FIG. 5 are the same as the display panel 50 and the heat dissipating sheet 153 of FIGS. 3 and 4.

The chassis base 11 according to the present embodiment is composed of a conductive material.

The EMI sponge 155 is formed by adhering a conductive fabric, a conductive film or a metal foil to the outside of an elastic sponge as in FIG. 4, but the EMI sponge 155 contacts a metal sheet layer 153b included in the heat dissipating sheet 153 between the display panel 50 and the chassis base 11. That is, the EMI sponge 155 is disposed on the same side of the double-side adhesive element 54 as the heat dissipating sheet 153. The EMI sponge 155 contacts the display panel 50, the chassis base 11, and the metal sheet layer 153b. The size of the metal sheet layer 153b may be different from the sizes of the other layers 153a and 153c included in the heat dissipating sheet 153. In this case, a gap between the other layers 153a and 153c of the heat dissipating sheet 153 is filled with the EMI sponge 155 so that the EMI sponge 155 can contact the metal sheet layer 153b as shown in FIG. 5.

In the heat dissipation structure according to the third embodiment, the heat dissipating sheet 153 has a multi-layer structure and can improve thermal conductivity. Furthermore, the display panel 50 and the metal sheet layer 153b are electrically grounded to the chassis base 11, and thus, electromagnetic waves generated during the operation of the display panel 50 can be captured by the metal sheet layer 153b and discharged through the chassis base 11. Consequently, the influence of electromagnetic waves on the driving circuit board 40 installed on the rear side of the chassis base 11, and on circuit elements disposed on the driving circuit board 40, is remarkably reduced, and the electromagnetic waves radiating from the front of a display device are shielded while a user is watching video through the display device.

Figure 6:
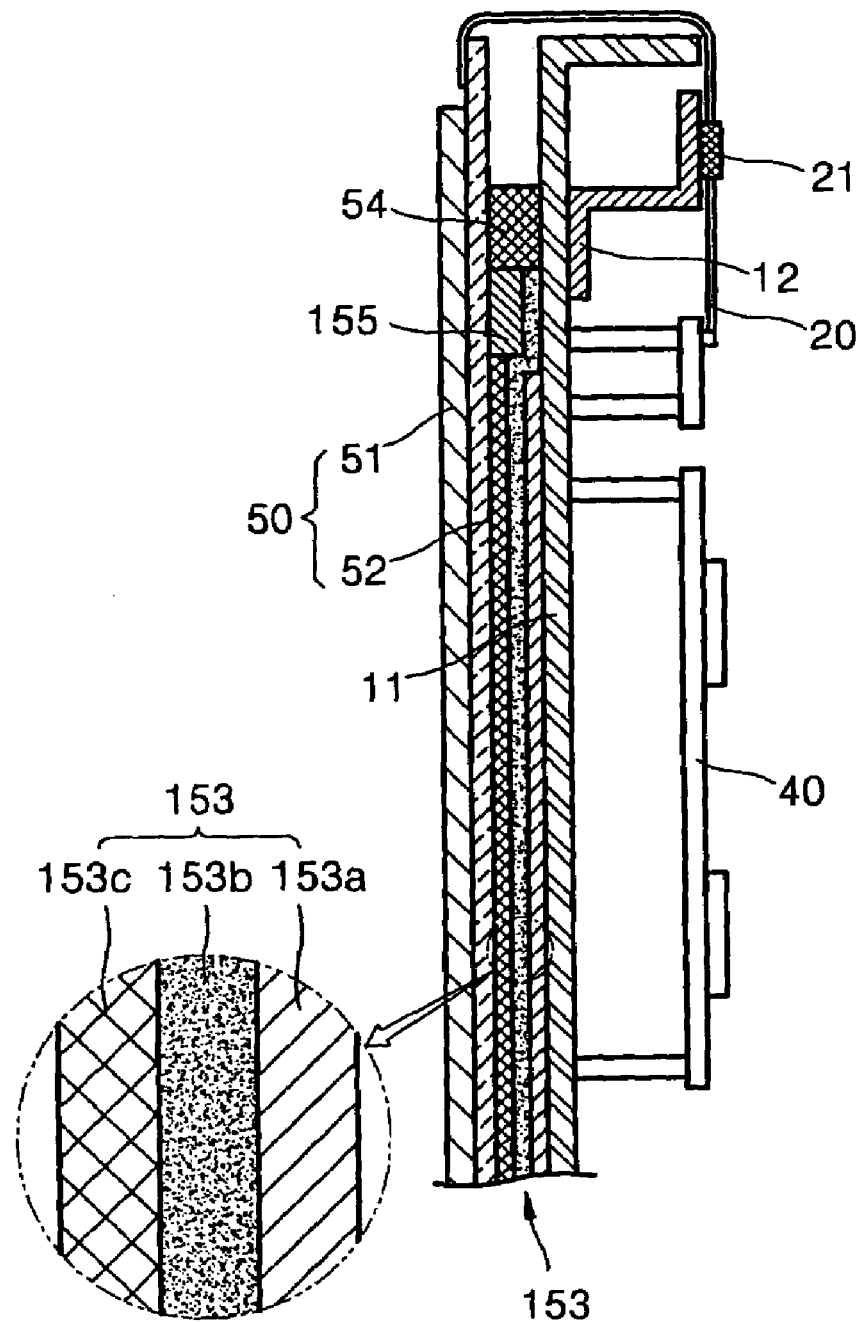
FIGS. 6 thru 8 are cross-sectional views of modifications of the heat dissipation structure of the display panel shown in FIG. 5.
Figure 7:
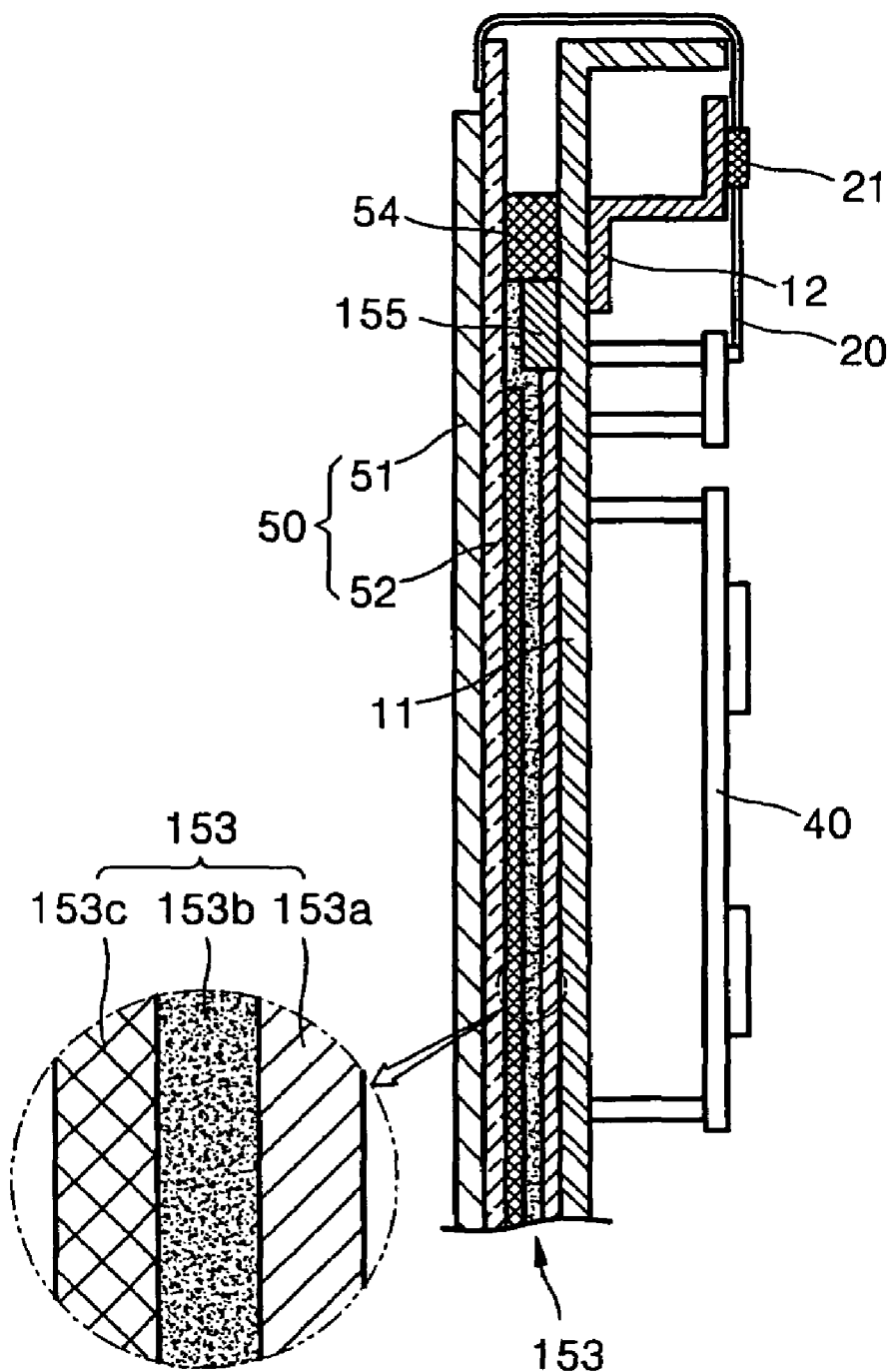
Figure 8:
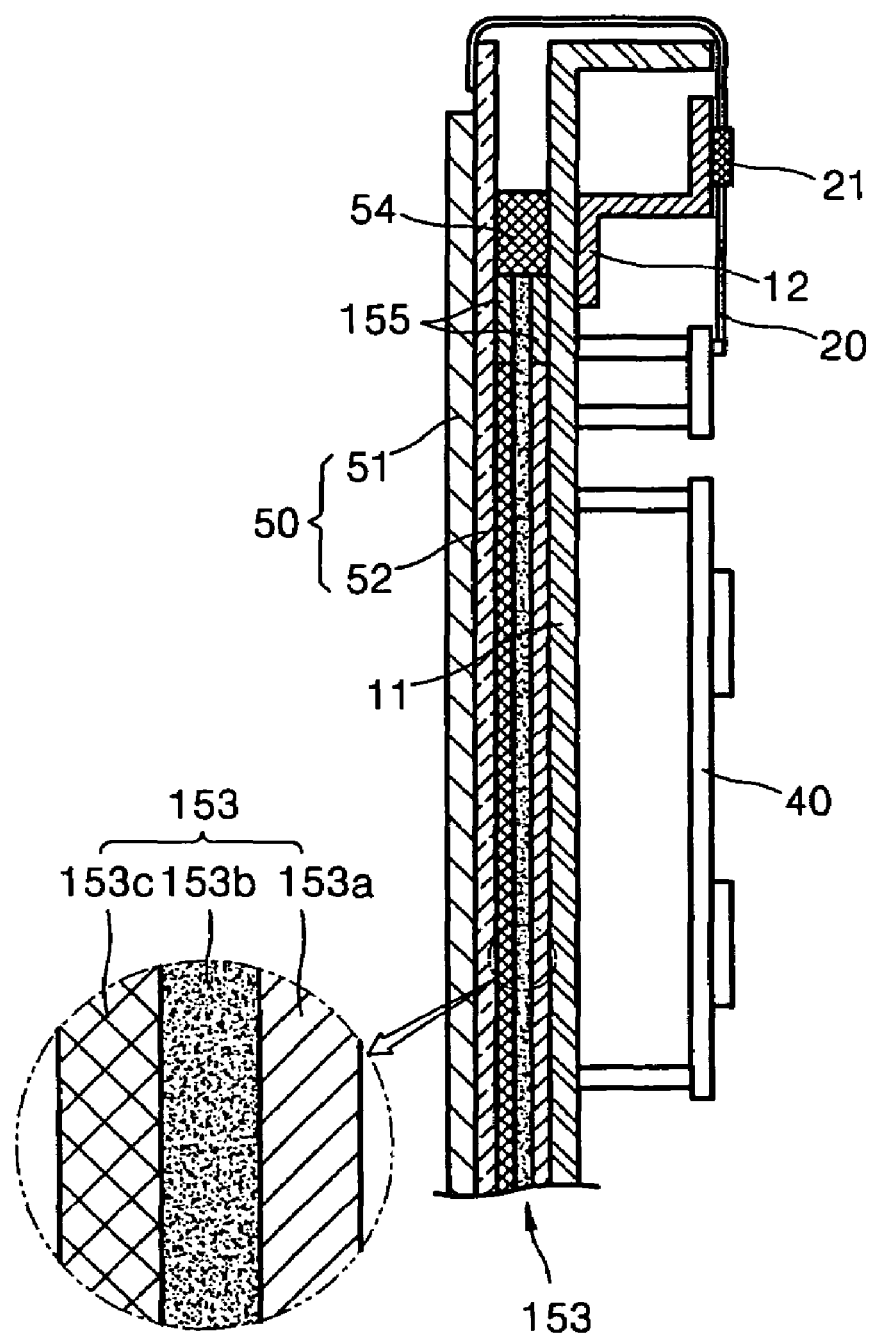

FIGS. 6 thru 8 are cross-sectional views of modifications of the heat dissipation structure of the display panel 50 shown in FIG. 5.

Referring to FIG. 6, the metal sheet layer 153b may have a bent portion at its end bent toward the chassis base 11. The bent portion of the metal sheet layer 153b contacts the chassis base 11. Furthermore, a space between the bent portion of the metal sheet layer 153b and the display panel 50 is filled with the EMI sponge 155.

Referring to FIG. 7, the metal sheet layer 153b may have a bent portion at its end bent toward the display panel 50. This bent portion of the metal sheet layer 153b contacts the display panel 50, and the space between the chassis base 11 and the bent portion of the metal sheet layer 153b is filled with the EMI sponge 155.

Referring to FIG. 8, an end of the metal sheet layer 153b may extend to the adhesive element 54 so as to protrude from the heat dissipating layers 153a and 153c. In this case, the EMI sponge 150 is disposed on both sides of the extended end of the metal sheet layer 153b.

In FIGS. 6 thru 8, the metal sheet layer 153b and the display panel 50 are electrically grounded to the chassis base 11. Accordingly, electromagnetic waves generated during the operation of the display panel 50 are captured by the metal sheet layer 153b, and are discharged through the chassis base 11 to the rear of a display module.

The heat dissipation structure described above can be used for any display panel that generates heat during operation, such as a plasma display panel that generates a lot of heat during operation, since a high voltage is applied to a plasma display panel and an image is displayed in a plasma display panel using plasma discharge.

As described above, according to the present invention, a heat dissipation structure in which a heat dissipating sheet has a multi-layer structure can be implemented by interposing a metal sheet layer between heat dissipating sheets, and therefore heat generated during the operation of the display panel is efficiently transmitted to the chassis base and is discharged.

In addition, the heat dissipation structure according to the present invention discharges electromagnetic waves generated during the operation of the display panel to the rear of the chassis base, thus effectively shielding the electromagnetic waves not only from the user, but also from circuit elements on a driving circuit board disposed on the rear side of the chassis base.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A heat dissipation structure for a display panel, comprising:
   a display panel;
   a heat dissipating sheet contacting a rear surface of the display panel; and
   a chassis base disposed on a rear side of the heat dissipating sheet, and connected to the display panel via a double-sided adhesive element;
   wherein the heat dissipating sheet includes two layers, and a metal sheet layer interposed between the two heat dissipating layers.

2. The heat dissipation structure of claim 1, wherein both of the two heat dissipating layers are made of graphite.

3. The heat dissipation structure of claim 1, wherein one of the two heat dissipating layers contacts the display panel and is made of graphite, and another of the two heat dissipating layers contacts the chassis base and is made of a material selected from one of a silicon group and an acryl group.

4. The heat dissipation structure of claim 1, wherein the heat dissipating sheet does not extend to edges of the rear surface of the display panel, a double-sided adhesive element is disposed a predetermined distance from the heat dissipating sheet, and an Electro Magnetic Interference (EMI) sponge is disposed in a space between the heat dissipating sheet and the double-sided adhesive element.

5. The heat dissipation structure of claim 4, wherein the metal sheet layer includes a bent end portion extending to and contacting the display panel, and the EMI sponge is disposed in a space between the bent end portion and the chassis base.

6. The heat dissipation structure of claim 4, wherein the metal sheet layer includes a bent end portion extending to and contacting the chassis base, and the EMI sponge is disposed in a space between the bent end portion and the display panel.

7. The heat dissipation structure of claim 4, wherein an end of the metal sheet layer extends further than the two heat dissipating layers, and the EMI sponge is disposed on front and rear surfaces of the metal sheet layer.

8. The heat dissipation structure of claim 1, wherein the heat dissipating sheet does not extend to edges of the rear surface of the display panel, a double-sided adhesive element is disposed a predetermined distance from the heat dissipating sheet, and an EMI sponge is disposed on a side of the double-sided adhesive element opposite to the heat dissipating sheet between the chassis base and the display panel.

9. The heat dissipation structure of claim 1, wherein the display panel is a plasma display panel.

10. A display module, comprising:
    a display panel;
    a driving circuit board driving the display panel;
    a chassis base supporting the display panel and the driving circuit board; and
    a heat dissipating sheet having a surface contacting a rear surface of the display panel;
    wherein the chassis base is connected to the display panel via a double-sided adhesive element, and the heat dissipating sheet includes two heat dissipating layers and a metal sheet layer interposed between the two heat dissipating layers.

11. The display module of claim 10, wherein both of the two heat dissipating layers are made of graphite.

12. The display module of claim 10, wherein one of the two heat dissipating layers contacts the display panel and is made of graphite and another of the two heat dissipating layers contacts the chassis base and is made of a material selected from one of a silicon group and an acryl group.

13. The display module of claim 10, wherein the heat dissipating sheet does not extend to edges of the rear surface of the display panel, a double-sided adhesive element is disposed a predetermined distance from the heat dissipating sheet, and an Electro Magnetic Interference (EMI) sponge is disposed in a space between the heat dissipating sheet and the double-sided adhesive element.

14. The display module of claim 13, wherein the metal sheet layer includes a bent end portion extending to and contacting the display panel, and the EMI sponge is disposed in a space between the bent end portion and the chassis base.

15. The display module of claim 13, wherein the metal sheet layer includes a bent end portion extending to and contacting the chassis base, and the EMI sponge is disposed in a space between the bent end portion and the display panel.

16. The display module of claim 13, wherein an end of the metal sheet layer extends further than the two heat dissipating layers, and the EMI sponge is disposed on front and rear surfaces of the metal sheet layer.

17. The display module of claim 10, wherein the heat dissipation sheet does not extend to edges of the rear surface of the display panel, a double-sided adhesive element is disposed a predetermined distance from the heat dissipating sheet, and an EMI sponge is disposed on a side of the double-sided adhesive element opposite to the heat dissipating sheet between the chassis base and the display panel.

* * * * *